(12) United States Patent
Clerici et al.

(10) Patent No.: US 6,175,226 B1
(45) Date of Patent: Jan. 16, 2001

(54) DIFFERENTIAL AMPLIFIER WITH COMMON-MODE REGULATING CIRCUIT

(75) Inventors: Giancarlo Clerici, Vimodrone; Luciano Tomasini, Monza, both of (IT)

(73) Assignee: STMicroelectronics, S.r.l., Agrate Brianza (IT)

(*) Notice: Under 35 U.S.C. 154(b), the term of this patent shall be extended for 0 days.

(21) Appl. No.: 09/518,562

(22) Filed: Mar. 3, 2000

(30) Foreign Application Priority Data

Mar. 5, 1999 (IT) .............................................. MI99A0458

(51) Int. Cl.[7] ....................................................... G05F 3/16
(52) U.S. Cl. ............................ 323/313; 323/316; 330/257
(58) Field of Search ..................................... 323/313, 315, 323/316, 314; 330/257

(56) References Cited

U.S. PATENT DOCUMENTS

| | | | |
|---|---|---|---|
| 3,914,683 | * 10/1975 | Plassche | 323/316 |
| 4,472,648 | * 9/1984 | Prentice | 327/541 |
| 4,970,452 | * 11/1990 | Barbu et al. | 323/317 |
| 5,514,950 | * 5/1996 | Sevenhans et al. | 323/315 |
| 5,668,468 | * 9/1997 | Cargill | 323/316 |
| 5,801,524 | * 9/1998 | Boerstler | 323/315 |
| 5,973,487 | * 10/1999 | Henry | 323/280 |
| 6,018,236 | * 1/2000 | Keeth | 323/313 |

* cited by examiner

Primary Examiner—Peter S. Wong
Assistant Examiner—Bao Q. Vu
(74) Attorney, Agent, or Firm—Theodore E. Galanthay; Robert Iannucci; Seed IP Law Group, PLLC

(57) ABSTRACT

A fully differential amplifier, in other words one having differential inputs and outputs, is associated with a circuit to regulate the output voltage reference. This circuit contains a resistive divider connected between the output terminals of the differential amplifier, a diode between the intermediate connection of the divider and common bases of load transistors of the differential amplifier, and a current mirror having a first branch connected to a reference voltage generator and a second branch which forms a current generator connected between the common bases of the load transistors and ground. This provides an efficient feedback control system with low power consumption and takes up less space on an integrated circuit.

15 Claims, 4 Drawing Sheets

DIFFERENTIAL AMPLIFIER WITH COMMON-MODE REGULATING CIRCUIT

TECHNICAL FIELD

The present invention relates generally to differential amplifiers, and more particularly, to a fully differential amplifier with a circuit for regulating an output reference voltage.

BACKGROUND OF THE INVENTION

As is known, differential amplifiers with a fully differential output (fully differential amplifiers) are symmetrical circuit structures with two inputs and two outputs. Two voltages are taken from the outputs, and each voltage is the sum of two components, namely a differential component arising from the difference between input voltages of opposite sign, and a component, called the common-mode component, arising from variations of input voltages having the same sign.

Clearly, the working signal is the differential component which is obtained by taking the voltage between the two output terminals. The common-mode components, however, cause a unilateral voltage to be superimposed on the working signal, this being equivalent to a shift of a reference value of the differential output voltage. In many cases, the central value of the supply voltage of the differential amplifier is selected as this reference voltage, particularly in the case in which the input signals are symmetrical to an input reference voltage. In this way, the maximum dynamic range of the output signal is obtained. In the case of asymmetric input signals, however, it may be convenient to select a different value of the reference voltage.

The common-mode component, when arising from a structural imbalance of the final stage, in other words from components which are not identical in the two branches of the differential circuit, causes an additional shift of the output reference voltage. To prevent these effects of the common-mode component from reducing the output dynamic range, there is a known method of using a feedback control system which is provided by a circuit which senses the output common-mode component and acts on an operating parameter of the differential amplifier in such a way as to make the output reference voltage independent of the common-mode component.

A circuit structure of this type is shown schematically in FIG. 1. A differential amplifier, indicated as a whole by the number 10, comprises two pnp-type bipolar transistors T1 and T2 which are identical to each other and have their emitters connected together, through a first current generator G1, to the positive terminal of the supply voltage, indicated by Vdd. The collectors of the transistors T1 and T2 are connected, each through an active load comprising an npn-type bipolar transistor T3 and T4, to the negative terminal of the supply voltage, represented by the ground symbol. The two transistors T3 and T4 have their bases connected together, through a second current generator G2, to the ground terminal, and their collectors connected to corresponding constant current generators G3 and G4 which are identical to each other. The differential amplifier has two input terminals INP and INM connected to the bases of the input transistors T1 and T2, and two output terminals OUP and OUM connected to the collectors of the said transistors T1 and T2.

A voltage divider consisting of two resistors R of equal resistance is connected between the output terminals OUP and OUM of the differential amplifier 10. The intermediate connection of the divider is connected to the inverting terminal of an operational amplifier 11. A voltage, indicated by $V_{cm}$, which is the reference voltage selected for the differential output (for example the central value of the supply voltage of the differential circuit) is applied to the non-inverting terminal of the operational amplifier 11. The voltage divider and the operational amplifier 11 together form a circuit, indicated as a whole by the number 15, for regulating the output reference voltage.

In operation, an error voltage Ve, which is proportional to the deviation of the mean output voltage $(V_{OUP}-V_{OUM})/2$ from the reference value $V_{cm}$, is present at the output of the operational amplifier 11. The error voltage Ve is applied to the differential amplifier 10 to be regulated. In this example, it acts on the generator G1 in such a way as to modify in the same direction and by the same amount the currents in the two branches of the differential amplifier, and thus to modify the output voltages $V_{OUP}$ and $V_{OUM}$ with a sign such that the error is cancelled.

However, a solution such as that described above requires a power consumption which in many applications in not negligible, and which leads to the operational amplifier 11 and the resistors R taking up a certain amount of space when the amplifier and the corresponding regulator are formed in an integrated circuit.

Another known solution for the feedback circuit is shown in FIG. 2. Two pairs of differential amplifiers having a common input terminal, to which the common-mode reference voltage $V_{cm}$ is applied, and having their other two input terminals connected to the outputs $V_{OUM}$ and $V_{OUP}$ of the differential amplifier 10, are used to detect the mean value of the output of the differential amplifier to be regulated (not shown). Each amplifier is formed by two identical npn-type bipolar transistors, indicated by T5, T6 and T7, T8, each having its emitter connected to one terminal of the supply voltage, indicated by the ground symbol, through a resistor R1 and a constant current generator G3. The collectors of the transistors T6 and T7 are connected directly to the positive pole of the supply voltage Vdd, and the collectors of the transistors T5 and T8 are connected together at a node N which is connected, through a MOSFET transistor M1 connected as a diode (with the drain and gate terminals in common), to the said positive pole Vdd. The gate terminal of the transistor M1 is connected to one input terminal In1 of an operational amplifier 12. The other terminal In2 of the operational amplifier 12 is connected to the junction between a constant current generator G3, identical to those of the differential amplifiers, whose other terminal is connected to ground, and another MOSFET transistor M2, which is identical to the transistor M1 and is also connected as a diode, with its source terminal connected to the positive pole Vdd. The output of the operational amplifier 12 is connected to the differential amplifier (not shown) which requires the common-mode regulation.

In conditions of perfect balancing, a current I/2, where I is the current generated by each of the generators G3, flows in each branch of the coupled differential amplifiers. The current of two branches is added together at the node N, so that a current I flows through the transistor M1. There will be a voltage determined by the resistance between the source and drain of the transistor M1 at the input In1 of the operational amplifier 12. A current I also flows through the transistor M2, and therefore the same voltage will be present at the terminal In2 of the operational amplifier 12. Consequently, no error voltage will be present at the output of the operational amplifier 12.

As may easily be verified, any imbalance, in other words any variation in the same direction of the voltages $V_{OUP}$ and $V_{OUM}$ at the outputs OUP and OUM of the differential amplifier to be regulated, is immediately compensated by the feedback of the circuit described above, and therefore the mean value of the output voltages is maintained at the predetermined reference value $V_{cm}$.

The circuit structure described above also has disadvantages, the main disadvantage being a reduced dynamic range; in other words, it operates correctly only with small variations of the output voltages of the differential amplifier to be regulated. Another disadvantage is that the circuit takes up a significant amount of space on an integrated circuit.

A feedback circuit operating with switched capacitors has also been proposed to reduce the power consumption. However, this circuit requires a clock generator at a relatively high frequency, which generates perturbations at the outputs at the clock frequency and at twice this frequency. In some applications, these perturbations are not acceptable.

SUMMARY OF THE INVENTION

An advantage of the present invention is to provide a differential amplifier circuit to regulate the output reference voltage which does not have the disadvantages of the prior art, in other words one which requires no appreciable power consumption, which occupies a much smaller area, and which does not require frequency generators which may perturb the outputs.

These advantages are provided by the differential amplifier circuit and method recited in the claims.

BRIEF DESCRIPTION OF THE DRAWINGS

The invention will be more clearly understood from the following detailed description of two embodiments of the invention provided by way of example with reference to the attached drawings, in which.

DETAILED DESCRIPTION OF THE ILLUSTRATED EMBODIMENTS

Figure 1:
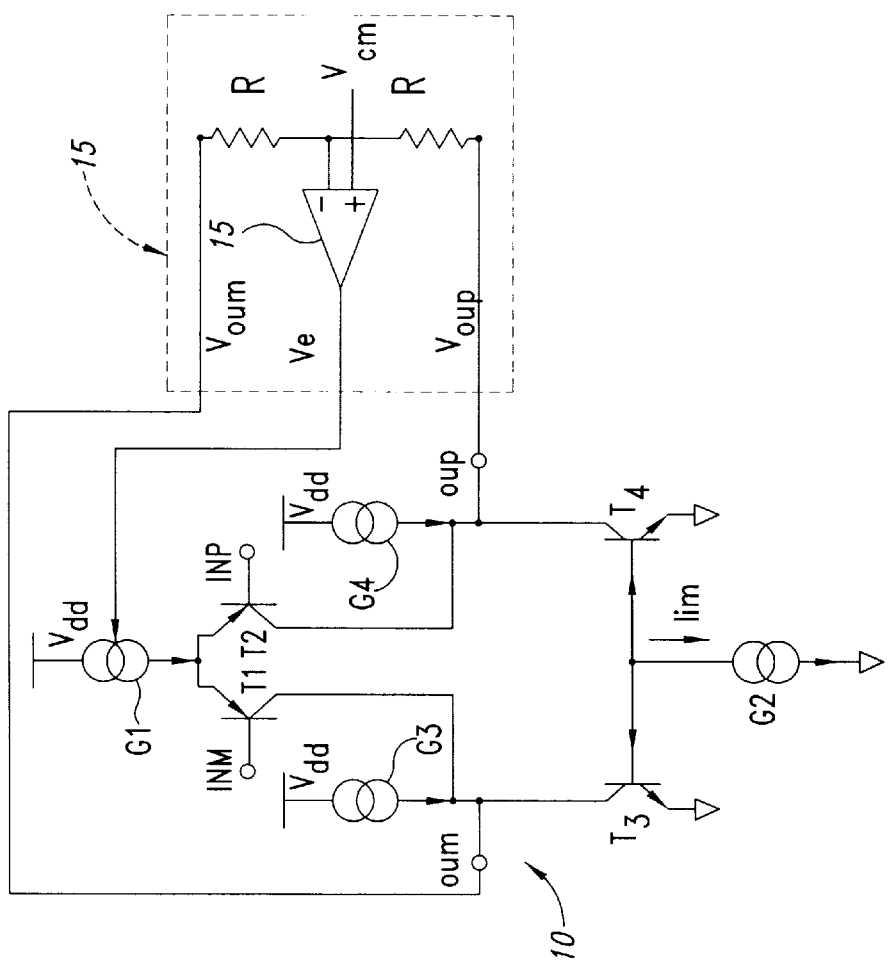
FIG. 1 shows a known circuit structure of a differential amplifier with a circuit for regulating the output reference voltage.
Figure 2:
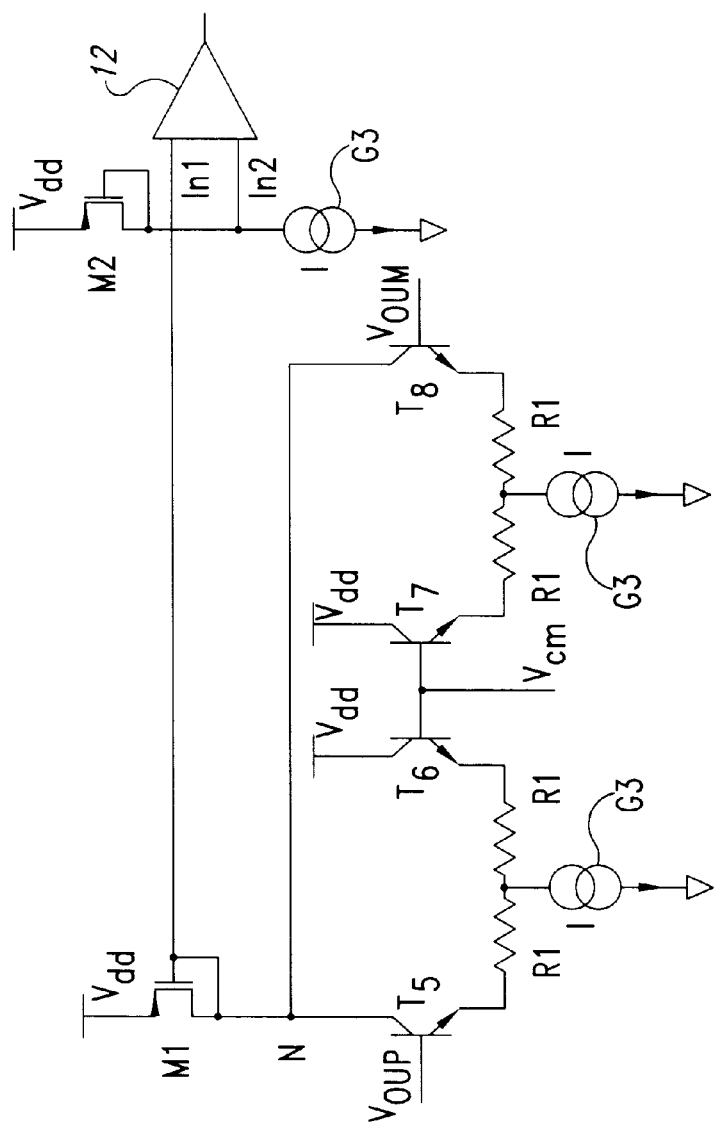
FIG. 2 shows a known circuit for regulating the output reference voltage.
Figure 3:
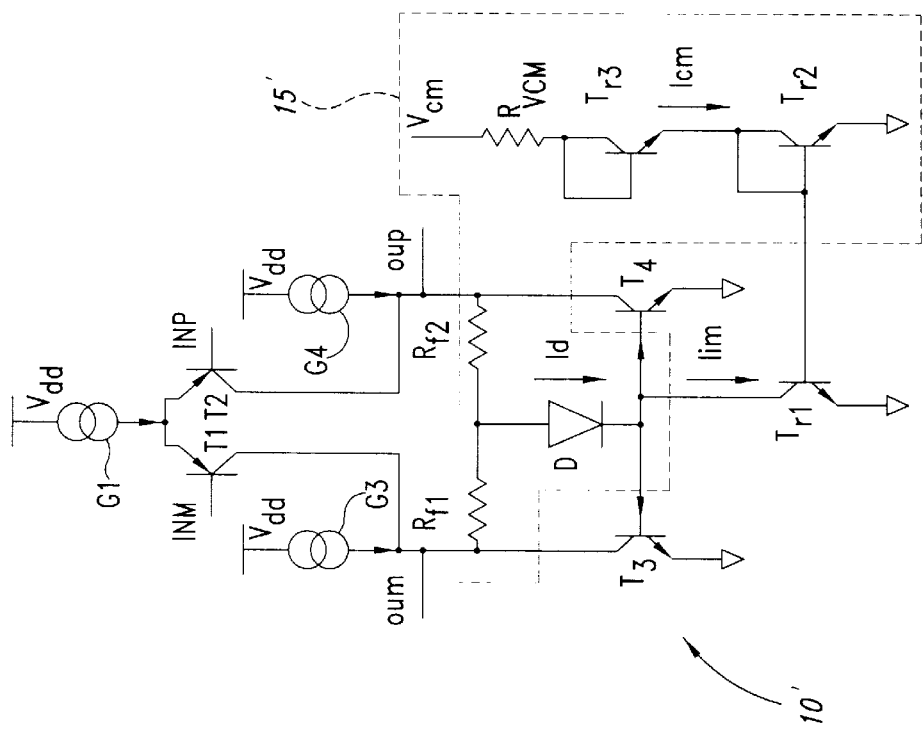
FIGS. 3 and 4 show two embodiments of a circuit to regulate the output reference voltage according to principles of the invention.

The embodiment of the circuit shown in FIG. 3, where elements identical to those in FIG. 1 are indicated by the same reference numbers or symbols, comprises a differential amplifier, indicated by 10', and a circuit to regulate the output reference voltage, indicated by 15'. The regulating circuit 15' comprises a resistive divider, consisting comprising in this example of two resistors Rf1 and Rf2 of equal resistance, connected between the collectors of the input transistors T1 and T2 and a unidirectionally conducting component (in this example a diode D, connected between the intermediate connection of the resistive divider Rf1, Rf2 and the common bases of the transistors T3 and T4, and a current mirror).

The current mirror has a first branch comprising, in series with each other, a first npn transistor Tr2 connected as a diode with the emitter connected to the ground terminal, a second npn transistor Tr3 connected as a diode and a resistor $R_{VCM}$. A reference voltage $V_{cm}$ generated by a power source (not shown) is applied to the resistor $R_{VCM}$. The current mirror has a second branch consisting of an npn transistor Tr1 with its base connected to the base of the transistor Tr2 connected as a diode, its emitter connected to the ground terminal, and its collector connected to the common bases of the load transistors T3 and T4.

The current passing through the first branch of the current mirror is $Icm=(V_{cm}-2 \times Vbe/R_{VCM})$, where Vbe is the voltage drop across each of the two transistors Tr2 and Tr3 connected as a diode and forward biased. In this example, the transistor Tr1 of the second branch of the mirror is identical to the transistor Tr2 of the first branch, and therefore, if the base currents are disregarded, the current passing through the second branch of the current mirror is identical to 1 cm. In this example, the resistances of the resistors Rf1 and Rf2 of the circuit are selected in such a way that $Rf1=Rf2=R_{VCM}/2$.

It may easily be seen that, with the circuit structure as described, the output reference voltage of the differential amplifier remains fixed at the value of the reference voltage $V_{cm}$, independently of any imbalances of the circuit.

In the first place, the case in which the mean output common-mode voltage is equal to the reference voltage $V_{cm}$ will be considered:

$(V_{OUM}+V_{OUP})/2=V_{cm}$

The current passing through the diode D will be Id=Iim= Icm.

We shall now assume that the mean common-mode voltage is greater than $V_{cm}$:

$(V_{OUM}+V_{OUP})/2>V_{cm}$

In this case, the current passing through the diode D would be

Id>Iim.

Since the current Iim is fixed to the constant value Icm of the mirror, the base currents of the two transistors T3 and T4 should increase. However, an increase in the base currents would cause an increase in the conduction of T3 and T4 and consequently a decrease in their collector voltages. Since such a decrease would tend to cancel out the assumed increase of the mean common-mode output voltage, the regulating circuit 15' produces a negative feedback which tends to keep the output reference voltage constant at the fixed value $V_{cm}$.

As may easily be seen, the circuit according to the described embodiment of the invention has a low power consumption and occupies a smaller area by comparison with the known circuits, since it essentially has only one current mirror acting as the regulating circuit.

It will be clear to a person skilled in the art that numerous variants are possible. For example, the relation between the resistor $R_{VCM}$ and the resistors Rf1, Rf2 could be different from that shown; in other words, it could be $Rf1=Rf2=K \times R_{VCM}/2$, where K is a proportionality factor. In this case, the same proportionality factor would have to appear in the relation between the currents in the two branches of the current mirror, and therefore also between the areas of the transistors Tr1 and Tr2. Additionally, the transistors T1 and T2 could be different from each other, and in this case the resistors Rf1 and Rf2 would also have to have different resistances.

Figure 4:
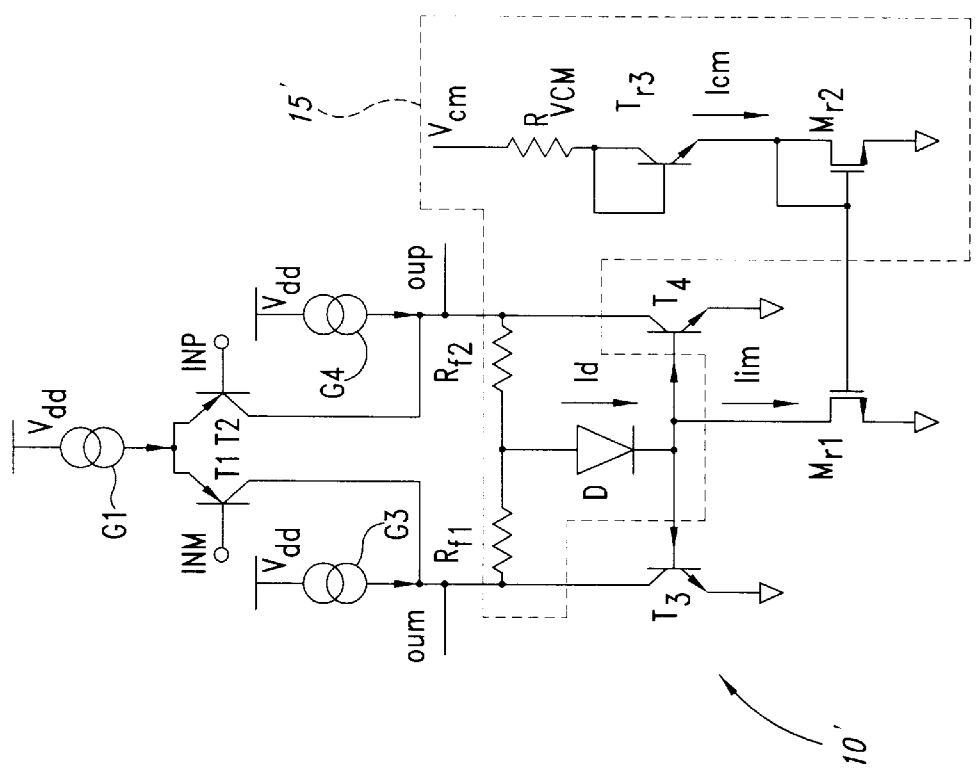

Further pnp-type transistors could be used in place of the npn-type transistors, and vice versa, or combinations of bipolar transistors and field-effect transistors could be used. In this connection, the reader should consider the circuit shown in FIG. 4, in which two n-channel field-effect transistors, indicated by Mr1 and Mr2, are used in place of the bipolar transistors Tr1 and Tr2 of FIG. 3. This embodiment of the invention is advantageous when the base currents of the transistors Tr1 and Tr2 are not negligible and when it is desired to avoid problems due to the saturation of the bipolar transistors. It also makes it possible to obtain a further saving of space and an even lower power consumption.

Therefore, the above description of illustrated embodiments is not intended to be exhaustive or to limit the invention to the precise forms disclosed. Accordingly, the invention is not limited by the disclosure, but instead the scope of the invention is to be determined entirely by the following claims, which are to be construed in accordance with established doctrines of claim interpretation.

What is claimed is:

1. A differential amplifier circuit to regulate an output reference voltage, the differential amplifier circuit comprising two input transistors, each with a first terminal, a second terminal and a control terminal, and each having its first terminal connected to the first terminal of the other and, through a first current generator, to a first power supply terminal;

two load transistors, each with a first terminal, a second terminal and a control terminal, and each having its control terminal connected to the control terminal of the other and, through a second current generator, to a second power supply terminal, and each of the load transistors having its first terminal connected to the second power supply terminal and its second terminal connected to the second terminal of one of the two input transistors;

two input terminals, each connected to a corresponding control terminal of the two input transistors;

two output terminals, each connected to a corresponding second terminal of one of the two input transistors;

a resistive divider connected between the second terminals of the two input transistors;

a unidirectionally conducting component connected between an intermediate connection of the resistive divider and the control terminals of the two load transistors; and a current mirror having a first branch connected to a constant reference voltage generator and a second branch comprising the second current generator.

2. The differential amplifier circuit according to claim 1 wherein the first branch of the current mirror comprises a transistor connected as a diode and wherein the second current generator comprises a transistor having a control terminal connected to a control terminal of the transistor connected as a diode.

3. The differential amplifier circuit according to claim 1 wherein the two input transistors comprise pnp-type bipolar transistors and the two load transistors comprise two npn-type bipolar transistors.

4. The differential amplifier circuit according to claim 1 wherein the current mirror comprises npn-type bipolar transistors.

5. The differential amplifier circuit according to claim 1 wherein the current mirror comprises n-channel field-effect transistors.

6. The differential amplifier circuit according to claim 1 wherein the first branch of the current mirror comprises an npn-type bipolar transistor connected as a diode in series with a resistor.

7. A circuit coupled to a differential amplifier to regulate an output reference voltage, the circuit comprising:

a current mirror circuit having a first branch connected to a reference voltage source structured to generate a reference voltage value and a second branch having a current generator;

a diode connected to a first terminal of the current generator and to a midpoint of a resistive divider coupled across output terminals of the differential amplifier, wherein the current mirror circuit is structured to fix the output reference voltage at the reference voltage value.

8. The circuit of claim 7 wherein the current generator of the second branch comprises a transistor having a first terminal coupled to the diode, a second terminal coupled to the first branch, and a third terminal coupled to ground.

9. The circuit of claim 7 wherein the first branch of the current mirror comprises a series connection of diode-connected first and second transistors and wherein a control terminal of the second transistor is connected to a second terminal of the current generator of the second branch.

10. The circuit of claim 7 wherein the first circuit branch further comprises a resistor connected in series with the reference voltage source.

11. The circuit of claim 8, further comprising a pair of load transistors coupled across the output terminals of the differential amplifier, wherein the load transistors are connected together by their control terminals, and wherein the resistive divider is connected to collector terminals of each of the load transistors.

12. The circuit of claim 7 wherein the first branch of the current mirror comprises a series connection of diode-connected first and second field-effect transistors and wherein a gate terminal of the second transistor is connected to a second terminal of the current generator of the second branch.

13. A method to regulate an output reference voltage of a differential amplifier having load transistors coupled to its output terminals, the method comprising:

providing a current mirror circuit having first and second circuit branches, wherein the second circuit branch is coupled to first terminals of the load transistors;

providing a reference voltage value to the first branch of the current mirror circuit and generating a first current through the first branch;

mirroring the first current with a second current in the second current branch; and if a mean common-mode voltage of the differential amplifier is greater than the reference voltage value, increasing current through the first terminals of the load transistors and correspondingly decreasing voltages at second terminals of the load transistors coupled to the output terminals of the differential amplifier to keep the output reference voltage fixed at the reference voltage value.

14. The method of claim 13, further comprising coupling a resistive divider across the output terminals of the differential amplifier.

15. The method of claim 13, further comprising:

coupling a resistive divider across the output terminals of the differential amplifier;

coupling the second circuit branch at an intermediate point of the resistive divider via an electrical connection; and if a mean common-mode voltage of the differential amplifier is equal to the reference voltage value, providing a current through the electrical connection equal to the second current through the second branch.

* * * * *

UNITED STATES PATENT AND TRADEMARK OFFICE
CERTIFICATE OF CORRECTION

PATENT NO. : 6,175,226 B1            Page 1 of 1
DATED : January 16, 2001
INVENTOR(S) : Clerici et al.

It is certified that error appears in the above-identified patent and that said Letters Patent is hereby corrected as shown below:

<u>Title page,</u>
Item [30], Foreign Priority Application number should read -- MI99A000458 --

<u>Column 6, claim 11,</u>
Line 17, "The circuit of claim 8" should read -- The circuit of claim 7 --.

Signed and Sealed this

Fifth Day of March, 2002

Attest:

JAMES E. ROGAN
*Attesting Officer*     *Director of the United States Patent and Trademark Office*